United States Patent [19]
Kobayashi et al.

[11] Patent Number: 5,914,907
[45] Date of Patent: Jun. 22, 1999

[54] SEMICONDUCTOR MEMORY DEVICE CAPABLE OF INCREASING CHIP YIELDS WHILE MAINTAINING RAPID OPERATION

[75] Inventors: Mako Kobayashi; Tetsushi Tanizaki; Kazutami Arimoto; Teruhiko Amano; Takeshi Fujino; Takahiro Tsuruda; Fukashi Morishita; Mitsuya Kinoshita, all of Hyogo, Japan

[73] Assignee: Mitsubishi Denki Kabushiki Kaisha, Tokyo, Japan

[21] Appl. No.: 09/122,760

[22] Filed: Jul. 27, 1998

[30] Foreign Application Priority Data

Feb. 3, 1998 [JP] Japan .................................. 10-021806

[51] Int. Cl.[6] ................................ G11C 8/00; G11C 7/00
[52] U.S. Cl. ...................... 365/230.03; 365/200; 365/201
[58] Field of Search .......................... 365/230.03, 230.06, 365/200, 201, 51

[56] References Cited

U.S. PATENT DOCUMENTS 5,642,323  6/1997  Kotani et al. ...................... 365/230.03
5,793,686  8/1998  Furutani et al. ................... 365/230.03
5,812,490  9/1998  Tsukude ............................ 365/230.03

FOREIGN PATENT DOCUMENTS 4-152565  5/1992  Japan .
9-74171   3/1997  Japan .

OTHER PUBLICATIONS

"A 1.6GB/s Data–Rate 1 Gb Synchronous DRAM with Hierarchical Square–Shaped Memory Block and Distributed Bank Architecture", Nitta et al., 1996 IEEE International Solid–State Circuits Conference, 1996 Digest of Technical Papers, pp. 376–377.

"256–Mb DRAM Circuit Technologies for File Applications", Kitsukawa et al., IEEE Journal of Solid–State Circuits vol. 28, No. 11 Nov. 1993, pp. 1105–1112.

Primary Examiner—David Nelms
Assistant Examiner—Trong Phan
Attorney, Agent, or Firm—McDermott, Will & Emery

[57] ABSTRACT

Regular memory cell arrays are arranged in divided regions in three rows and three columns except for the region located at the second row and the second column. The region located at the intersection of the second row and the second column is provided with a redundant memory cell array. The replacement operation of the regular memory cell arrays with the redundant memory cell array is provided for each memory cell block.

8 Claims, 14 Drawing Sheets

FROM MEMORY CELL ARRAY

FROM MEMORY CELL ARRAY

F I G. 11

| APPLICATION OF CENTRAL MEMORY ARRAY | MSW1 | MSW2 | MSW3 | MSW4 |
|---|---|---|---|---|
| FOR REDUNDANCY | ON | ON | ON | OFF |
| FOR PARITY | OFF | OFF | OFF | ON |

SEMICONDUCTOR MEMORY DEVICE CAPABLE OF INCREASING CHIP YIELDS WHILE MAINTAINING RAPID OPERATION

BACKGROUND OF THE INVENTION

1. Field of the Invention

The present invention relates to semiconductor memory devices, and more specifically to arrangement of the memory cell array of a semiconductor memory device and of the peripheral circuitry which processes the data held in the memory cell array.

2. Description of the Background Art

The chip size of a memory is increased as the memory has larger capacity. Also, as the manufacturing process is increasingly complicated, the number of process steps also tends to be increased. Thus, it has been very difficult to manufacture a memory cell array which does not include even one defective bit. Various approaches have been proposed to overcome this disadvantage. The techniques currently implemented include redundant circuit technique which provides addition of several redundant rows or columns of memory cells to a memory cell array and replacement of a row or column including a defective cell with a redundant row or column.

For example, a non-volatile programming is previously provided so that a spare decoder rather than the regular decoder provides a row select operation for the address signal corresponding to that row of memory cells in a regular array which includes a defective bit. When an address including a defective bit is externally input, the spare decoder is selected and simultaneously a selection prohibiting signal is output to the regular row decoder. Thus, a spare row is selected in place of a regular row.

With such a configuration, data can normally be read and written if a defective bit is present in a memory cell array.

In addition to the redundant circuit described above, parity bit data can also be held for the data held in a dynamic random access memory (DRAM).

As DRAMs have larger capacity, the memory cell area per bit and hence the electric charge stored tend to be reduced. This disadvantageously results in a soft error and the like caused by alpha particles discharged from a radio isotope contained in the materials for chip packages and interconnections. In order to overcome the disadvantage, typically a memory dedicated to parity bit as well as a DRAM are provided on a same board to detect defects. By contrast, a memory chip incorporating a memory cell which holds such a parity bit can detect defects without any other memory chip.

In a DRAM, an Error Checking and Correction (ECC) circuit can be buried in a memory cell array. The memory chip incorporating the ECC circuit can correct error bits and thus significantly improve the reliability of the memory. The incorporation of the ECC circuit into the chip itself also allows reduction of the number of chips on a board for which a system is configured.

To allow for larger capacity memories, a DRAM has also been proposed which has Built-in Self Test (BIST) function, wherein a circuit which produce test data for a chip itself, and a test result discriminator circuit are incorporated in the chip. When a tester inputs a test start signal to the chip, the chip outputs a test result in a predetermined period of time. Application of the BIST function dispenses with an expensive LSI tester and also allows a DRAM to be tested in a short period of time and thus provides an effective approach for testability.

However, the relief of defective bits employing such a redundant circuit as described above is also associated with the following disadvantage: microfabrication of a memory cell array increases the frequency of short-circuit between a word line and a bit line. This defect results in current leakage from the bit line via the word line in the standby operation and thus increases standby current. If the defects of word and bit lines are replaced by means of the redundant circuit, the defect caused by such short-circuit still remains. As an effective approach to the defect, block redundancy technique has been proposed in IEEE JOURNAL OF SOLID-STATE CIRCUITS, VOL. 28, No. 11, NOVEMBER 1993, p.1105–p.1112.

According to the block redundancy technique, a defective subarray can be electrically isolated and then replaced with a redundant subarray to reduce unnecessary power consumption and prevent the current leakage caused by short circuit between a word line and a bit line.

Thus, the increment itself of the standby current owing to short circuit between a word line and a bit line can be restricted if the memory capacity is of large scale.

For conventional DRAMs, however, memory array is typically divided into a plurality of regions, such as four regions, for arrangement.

FIG. 17 is a plan view showing an arrangement of a memory cell array in such a conventional DRAM.

A conventional DRAM 302 is configured of memory arrays 304–310 arranged in two rows and two columns, wherein a memory array has a ratio between longer side and shorter side of approximately 1:2.

In such an arrangement of the memory cell array, the distance from the peripheral circuitry to a circuit included in an array is different from that from the peripheral circuitry to a circuit included in another array. Accordingly, all control signals should be designed to be timed, taking into consideration the delay caused between the peripheral circuitry and a circuit in an array which is the most distant from the peripheral circuitry.

Replacement with a redundant column or row of memory cells in memory arrays 304–310, changes the distance from the peripheral circuitry to a circuit to be activated in an array. Accordingly, use of the redundant circuit can require a delayed timing of application of a control signal which is otherwise not delayed in timing.

This implies that while a defective bit itself can be relieved by the redundant circuit, it is necessary to consider the dependence on the time required for transmitting a control signal from the peripheral circuitry to the redundant circuit most distant from the peripheral circuitry in order to maintain a predetermined access time of the DRAM after the replacement with the redundant circuit.

SUMMARY OF THE INVENTION

An object of the present invention is to provide a semiconductor memory device capable of replacing with a redundant circuit while maintaining its rapid operation.

Another object of the present invention is to provide a semiconductor memory device capable of restricting the increment in power consumption in the standby operation.

Still another object of the present invention is to provide a semiconductor memory device which increases chip yield and also provides high reliability.

In summary, the present invention provides a semiconductor memory device formed at a main surface of a semiconductor substrate divided into chips and including eight memory cell arrays, a redundant memory cell array and a replacement circuit.

The semiconductor substrate is divided into regions in three rows and three columns and the eight memory cell arrays are arranged at their respective divided regions excluding the region located at the intersection of the second row and the second column.

Each memory cell array includes a plurality of word lines, a plurality of pairs of bit lines intersecting with the plurality of word lines, and a plurality of memory cells respectively provided at the intersections of the plurality of word lines and the plurality of pairs of bit lines.

Each memory cell array is divided into a plurality of first subblocks each having a first predetermined number of columns of memory cells and a second predetermined number of rows of memory cells.

The redundant memory cell array is arranged at the region located at the intersection of the second row and the second column.

The redundant memory cell array is divided into a plurality of second subblocks each having the first predetermined number of columns of memory cells and the second predetermined number of rows of memory cells.

If a first subblock of a memory cell array is defective, the replacement circuit replaces the first subblock of the memory cell array with a corresponding second subblock of the redundant memory cell array according to an external setting.

In another aspect of the present invention, a semiconductor memory device formed at a main surface of a semiconductor substrate divided into chips includes eight memory cell arrays, an auxiliary memory cell array and an operation switching circuit.

The semiconductor substrate is divided into regions in three rows and three columns and the eight memory cell arrays are arranged at their respective divided regions excluding the region located at the intersection of the second row and the second column.

Each memory cell array includes a plurality of word lines, a plurality of pairs of bit lines intersecting with the plurality of word lines, and a plurality of memory cells provided at the respective intersections of the plurality of word lines and the plurality of pairs of bit lines.

The auxiliary memory cell array is arranged at the region located at the intersection of the second row and the second column.

The operation switching circuit according to an external setting in a first mode of operation replaces any defective memory cell in a memory cell array with a corresponding memory cell of the auxiliary memory cell array for operation, and the operation switching circuit according to an external setting in a second mode of operation allows outputting the data from a memory cell in a memory cell array and the data from a memory cell in the auxiliary memory cell array that are selected according to an externally applied address.

In still another aspect of the present invention, a semiconductor memory device formed at a main surface of a semiconductor substrate divided into chips includes eight memory cell arrays and an operation circuit.

The semiconductor substrate is divided into regions in three rows and three columns and the eight memory cell arrays are arranged at the respective divided regions excluding the region located at the intersection of the second row and the second column.

Each memory cell array includes a plurality of word lines, a plurality of pairs of bit lines intersecting with the plurality of word lines, and a plurality of memory cells provided at the respective intersections of the plurality of word lines and the plurality of pairs of bit lines.

The operation circuit is arranged at the region located at the intersection of the second row and the second column, and detects any error in the data held in a selected memory cell in a memory cell array according to the data read from the selected memory cell.

Thus, a main advantage of the present invention is subblock-by-subblock replacement of regular memory cell arrays with a redundant memory cell array positioned at the intersection of the second row and the second column and hence an efficient replacement by means of a redundant circuit. Furthermore, since a redundant circuit is not required for each regular memory cell array, the number of subblocks for the redundancy operation can be minimized and chip area can be reduced.

Another advantage of the present invention is that the memory cell array arranged at the intersection of the second row and the second column can be used as not only a redundant memory cell array but also a memory cell array for storing a parity bit. Thus, if a defect rate is high in the initial stage of the manufacturing, a sufficient number of redundant memory cells can be used to improve product yield. Furthermore, when manufacturing technology is completed and yield is improved, all memory cell arrays can be used as equivalent memory cell arrays to achieve x 9 configuration.

Still another advantage of the present invention is that an operation circuit which detects errors can be arranged at the intersection of the second row and the second column to minimize the delay in the data transmission to the operation circuit and the delay in the accessing time of the operation circuit and thus provide an efficient error detection and hence a highly reliable memory.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a table for describing operational states of switches MSW1–MSW4.

DESCRIPTION OF THE PREFERRED EMBODIMENTS

First Embodiment

Figure 1:
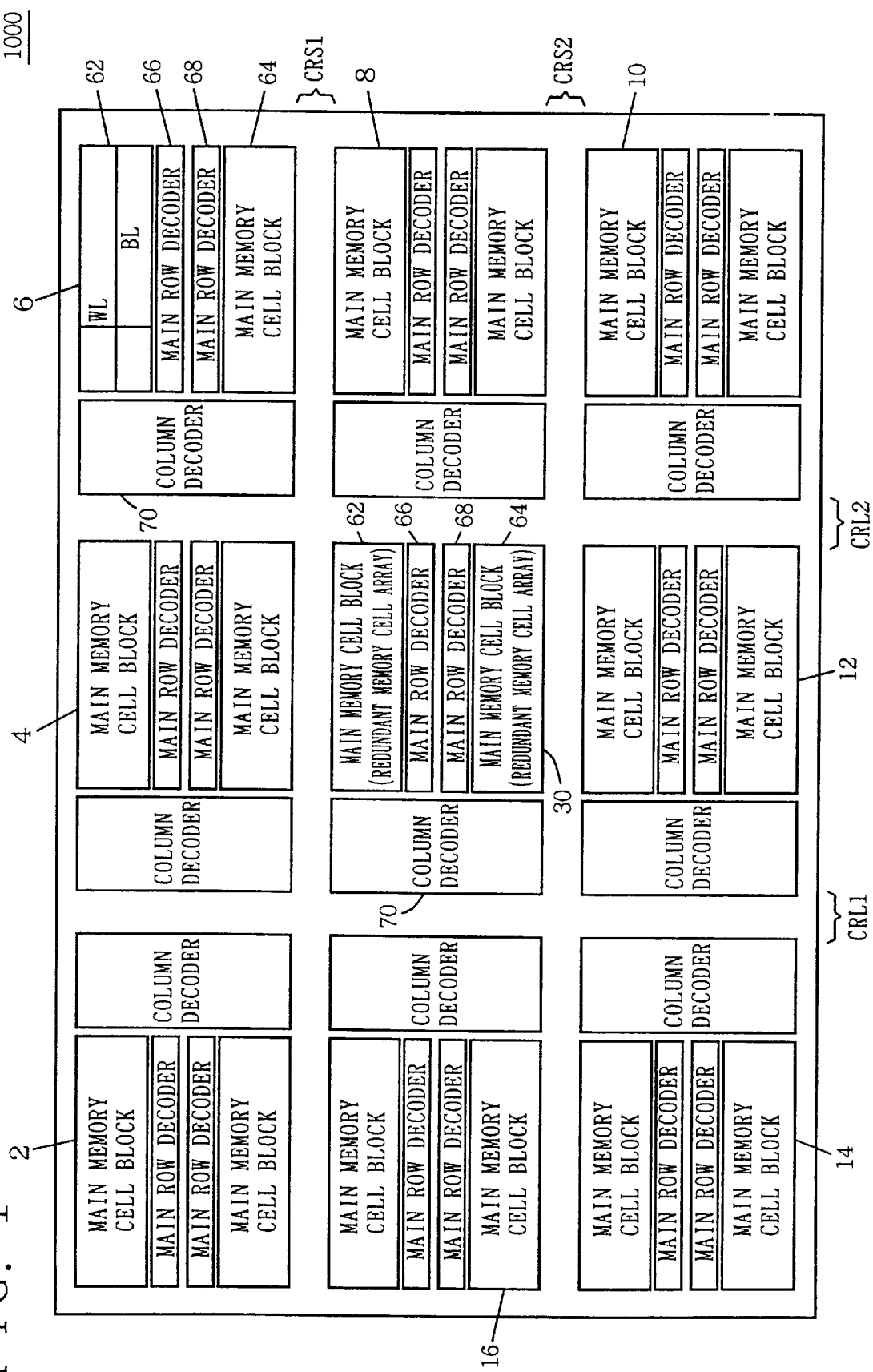
FIG. 1 is a plan view showing a configuration of a semiconductor memory device 1000 according to a first embodiment of the present invention.

FIG. 1 shows a configuration of a semiconductor memory device 1000 according to a first embodiment of the present invention.

Semiconductor memory device 1000 shown in FIG. 1 is divided into regions in three rows and three columns and memory arrays 2–16 are respectively arranged at the eight regions excluding the central region located at the intersection of the second row and the second column. Memory array 2 is arranged at the intersection of the first row and the first column. Memory array 4 is arranged at the intersection of the first row and the second column. Memory array 6 is arranged at the intersection of the first row and the third column. Memory array 8 is arranged at the intersection of the second row and the third column.

Memory array 10 is arranged at the intersection of the third row and the third column. Memory array 12 is arranged at the intersection of the third row and the second column. Memory array 14 is arranged at the intersection of the third row and the first column. Memory array 16 is arranged at the intersection of the second row and the first column.

Arranged at the central region located at the intersection of the second row and the second column is a redundant memory cell array 30 for memory arrays 2–16.

For example, memory cell array 6 includes: a first main block 62 of memory cells; a second main block 64 of memory cells; a main row decoder 66 responsive to an external row address signal for selecting a corresponding row (a word line WL) of the first main block 62 of memory cells; a main row decoder 68 responsive to an externally applied row address signal for selecting a corresponding row in the second main block 64 of memory cells; and a column decoder 70 responsive to an externally applied column address signal for selecting a corresponding column of memory cells (a pair of bit lines BL and /BL).

The other memory cell arrays 2, 4, 8–16 and redundant memory cell array 30 also have a similar configuration.

Semiconductor memory device 1000, having the semiconductor substrate divided into three columns in the direction along its longer side, also includes a boundary region CRL1 as a boundary between the first and second columns, and a boundary region CRL2 as a boundary between the second and third columns.

Semiconductor memory device 1000, having the semiconductor substrate divided into three rows in the direction along its shorter side, also includes a boundary region CRS1 between the first and second rows, and a boundary region CRS2 between the second and third rows.

The peripheral circuitry, such as a control circuit (not shown) for controlling the operation of semiconductor memory device 1000 and an address buffer (not shown) for receiving externally applied addresses, is arranged in regions CRLs1 and 2 and CRSs1 and 2.

Figure 2:
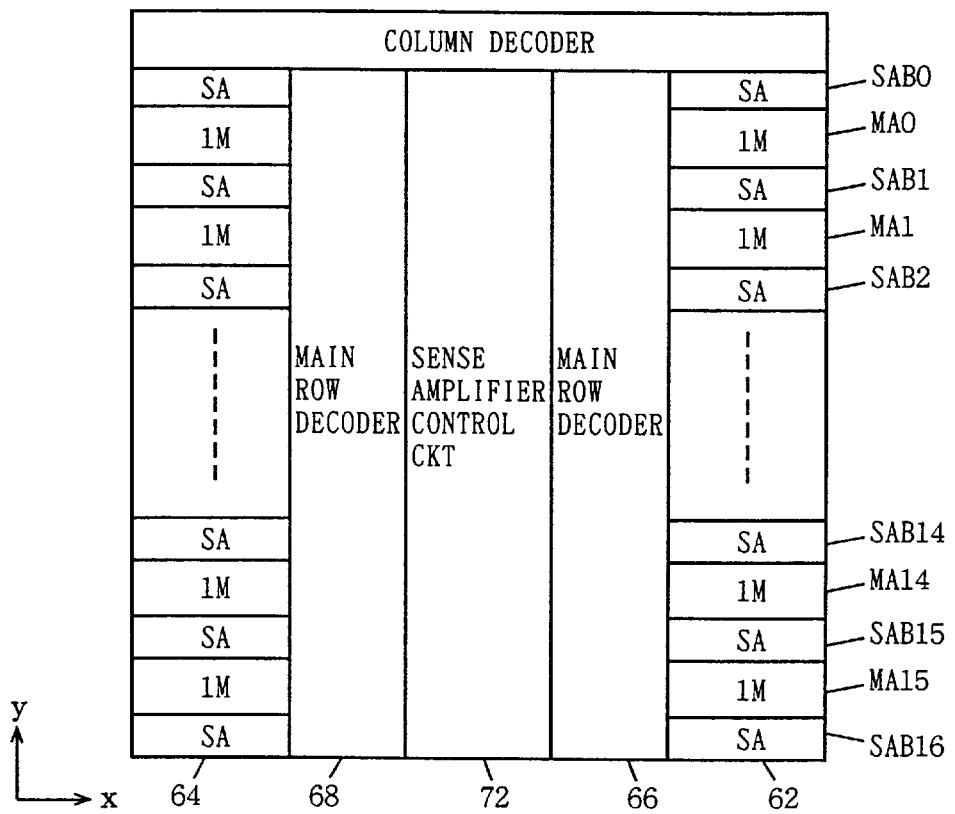
FIG. 2 is a conceptual view showing a configuration of a memory cell array 6.

FIG. 2 is a view for specifically illustrating a configuration of memory cell array 6 shown in FIG. 1.

Provided between main row decoders 66 and 68 is a sense amplifier control circuit 72 for controlling a timing at which a sense amplifier operates. Memory cell array 6 has e.g. a capacity of 32 MBits and accordingly main blocks 62 and 64 of memory cells each include memory cells having 16 MBits.

Main block 62 of memory cells also includes subarrays MA0–MA15 each including memory cells having one MBit.

Bands of sense amplifiers SAB0–SAB16 are arranged for subarrays of memory cells MA0–MA15, respectively.

For example, the band of sense amplifiers SAB1 is arranged so that it is shared by subarrays of memory cells MA0 and MA1.

The other bands of sense amplifiers SAB2–SAB15 are also arranged similarly.

Furthermore, main block 64 of memory cells also has a similar configuration.

Figure 3:
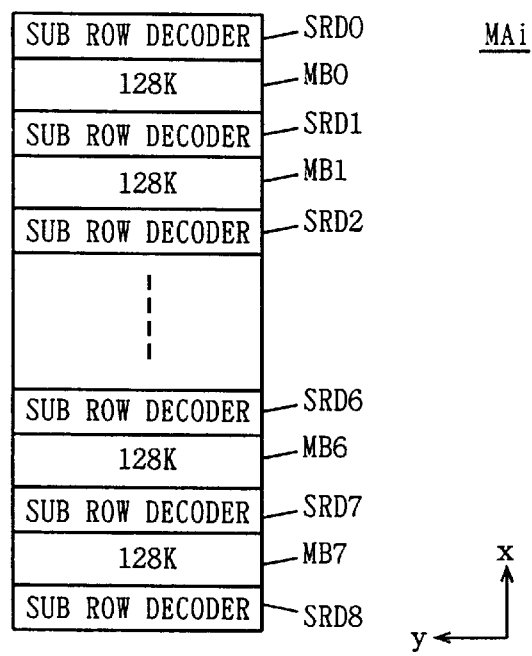
FIG. 3 is a conceptual view showing a configuration of a subarray of memory cells.

FIG. 3 is a conceptual view for illustrating a configuration of one of the subarrays of memory cells shown in FIG. 2, i.e. MAi, wherein i=0 to 15.

Subarray MAi of memory cells includes eight subblocks MB0–MB7 of memory cells, each block having a capacity of 128 kbits.

Subarray MAi of memory cells also includes sub row decoders SRD0–SRD8 provided for subblocks MB0–MB7 of memory cells, respectively.

As will be described later, replacement of memory cell arrays 2–16 with redundant memory cell array 30 is provided for each of subblocks MB0–MB7 of memory cells.

Figure 4:
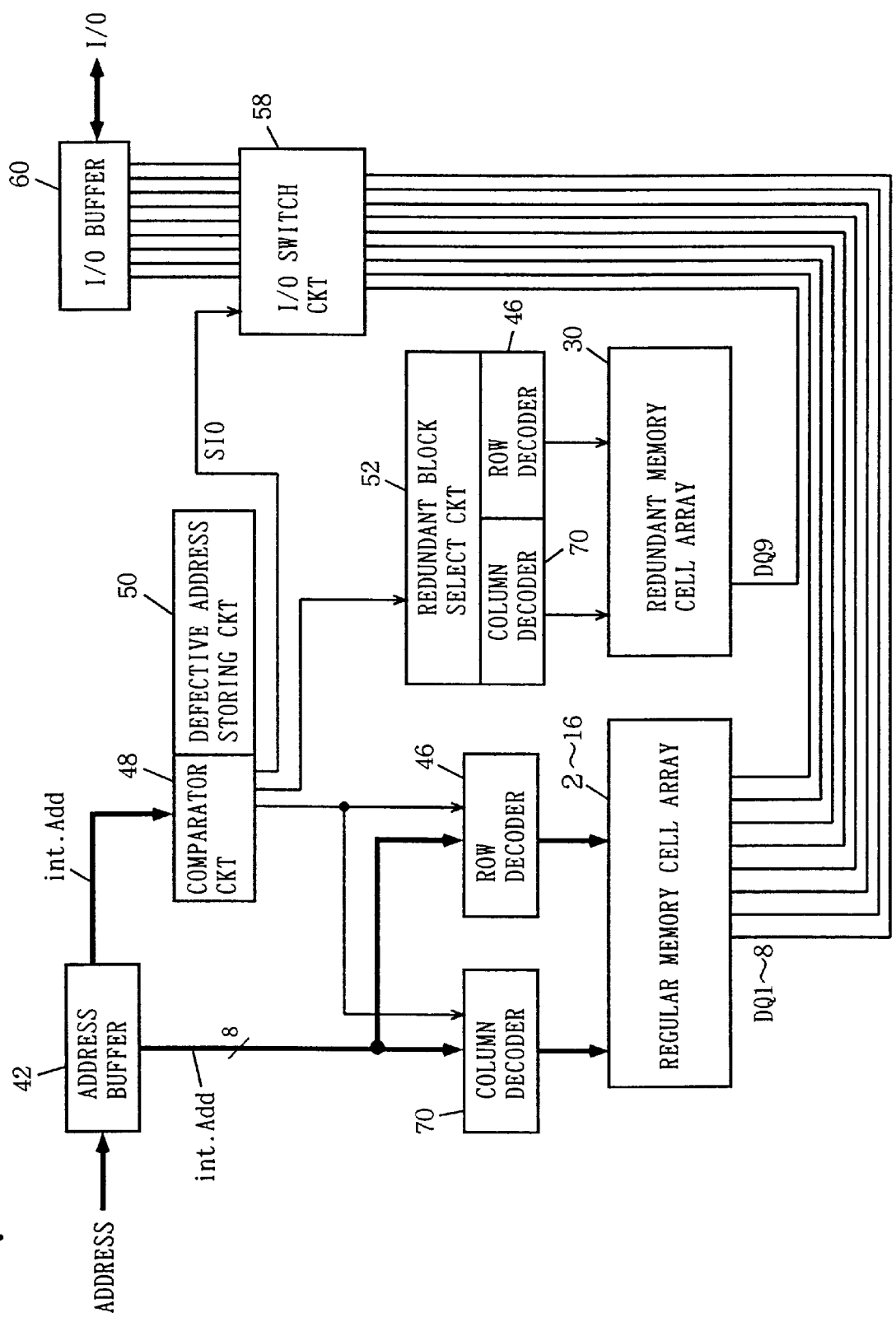
FIG. 4 is a schematic block diagram showing a configuration of a circuit which provides an access operation of semiconductor memory device 1000.

FIG. 4 is a schematic block diagram for illustrating a configuration of a circuit which provides an operation of selecting memory cells in the memory cell arrays and redundant memory cell array shown in FIG. 1.

An externally applied address signal Add is received by an address buffer 42 and is output as an internal address signal int.Add. The internal address int.Add is applied to a column decoder 70 and a row decoder 46 provided for regular memory cell arrays 2–16. Row decoder 46 includes main row decoders 66 and 68 and sub row decoders SRD0–SRD8 shown in FIGS. 2 and 3. The internal address signal int.Add is also input to a comparator circuit 48 for comparing the internal address signal int.Add with defective addresses based on an output from a defective address storage circuit 50 which stores defective addresses according to a non-volatile storing method which employs a fuse element or the like. When an internal address int.Add matches a defective address, comparator circuit 48 outputs to column decoder 70 and row decoder 46 provided for the regular memory cell arrays an access prohibiting signal IH which prohibits the operations of the decoders.

When an externally applied address does not match any of defective addresses, column decoder 70 and row decoder 46 for the regular memory cell arrays provides the operation of selecting a memory cell in the corresponding memory cell array among regular memory cell arrays 2–16.

If an externally applied address matches a defective address, the regular memory cell arrays are not accessed. When an internal address signal int.Add matches a defective address, comparator circuit 48 activates an operation of a redundant block select circuit 52 provided for redundant memory cell array 30.

Controlled by redundant memory select circuit 52, column decoder 70 and row decoder 46 provided for redundant memory cell array 30 provide the operation of selecting the corresponding memory cell in redundant memory cell array 30.

Row decoder 46 provided for redundant memory cell array 30 also includes main row decoders 66 and 68 and sub row decoders SRD0–SRD8.

An I/O switch circuit 58 receives and selectively outputs data DQ1–DQ8 from the respective regular memory cell arrays and data DQ9 from redundant memory cell array 30.

In other words, when an externally applied address signal does not match any of defective addresses, data DQ1–DQ8 are read and output from the regular memory cell arrays. When an externally applied address matches a defective address, comparator circuit 48 provides control and the data among the read data DQ1–DQ8 that is read from a memory cell array replaced with the redundant memory cell array is replaced with data DQ9 read from the redundant memory cell array and the replacement data is thus output.

An I/O buffer 60 receives an output from I/O switch circuit 58 and outputs data to the external.

While the data read operation has been described as above, the data write operation also includes switching between data transmission paths by means of I/O switch circuit 58.

Figure 5:
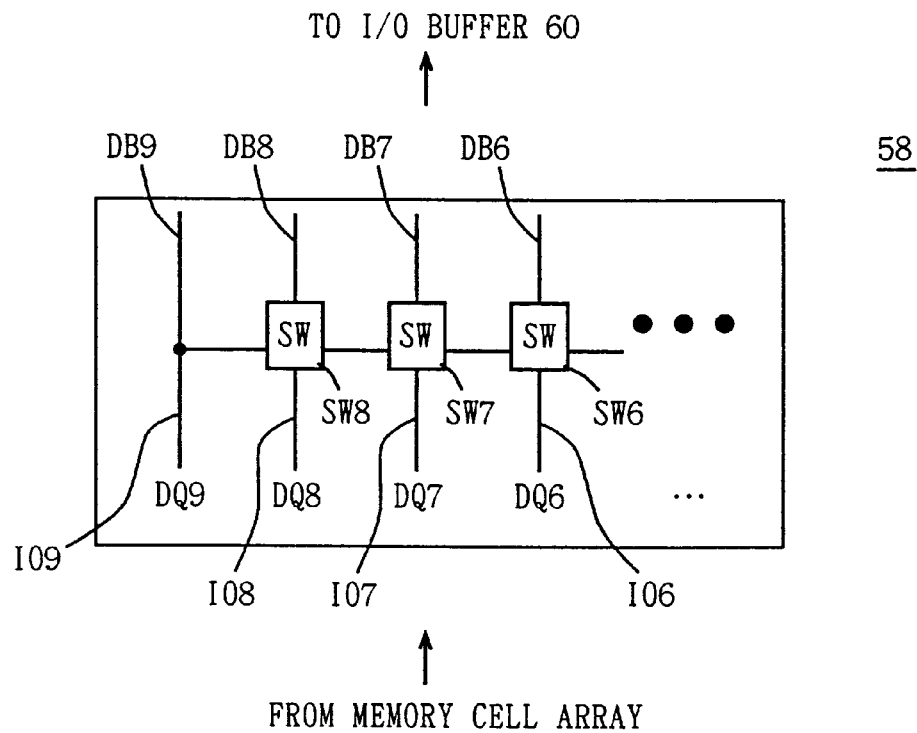
FIG. 5 is a schematic block diagram showing a configuration of an I/O switch circuit 58.

FIG. 5 is a schematic block diagram showing a configuration of I/O switch circuit 58 shown in FIG. 4.

Switch circuits SW1–SW8 are provided for I/O lines IO1–IO8 transmitting the data from regular memory cell arrays 2–16, respectively. Switch circuits SW1–SW8 also connects with an I/O line IO9 which transmits data DQ9 read from redundant memory cell array 30.

Figure 6:
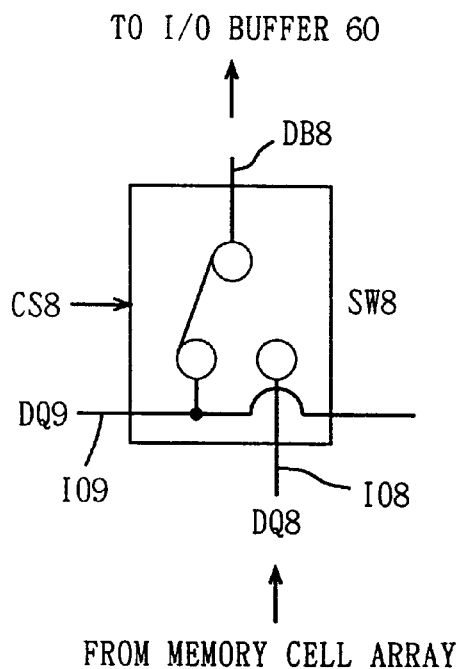
FIG. 6 is a conceptional view showing a configuration of a switch circuit SW8.

FIG. 6 is a conceptual view for illustrating a configuration of switch circuit SW8 shown in FIG. 5.

The other switch circuits SW1–SW7 also have a similar configuration.

Switch circuit SW8 responds to a switch signal CS8 from comparator circuit 48 to select one of I/O line IO8 transmitting data DQ8 read from regular memory cell array 16 and I/O line IO9 transmitting data read from redundant memory cell array 30 and connects the selected I/O line to a data bus DB8 for I/O buffer 60.

The other switch circuits SW1–SW7 also have a similar configuration.

With the configuration as described above, a subblock of memory cells in a regular memory cell array that includes any defective bit can be replaced with a corresponding subblock of memory cells in the redundant memory cell array to relieve semiconductor memory device 1000.

The arrangement of the redundant memory cell array at the center of a chip allows arbitrary replacement of subblocks of memory cells in the regular memory cell arrays and hence efficient arrangement of the redundant circuit.

Furthermore, it is not necessary to arrange a redundant subblock of memory cells for each regular memory cell array. Thus, the number of redundant subblocks of memory cells can be minimized depending on the frequency of occurrence of defective bits in the manufacturing process, effectively resulting in reduction of chip area.

Redundant memory cell array 30, having been described as having a similar memory capacity to that of regular memory cell arrays 2–16, can also have an optimal memory capacity depending on the frequency of occurrence of defective bits in the manufacturing process.

Figure 7:
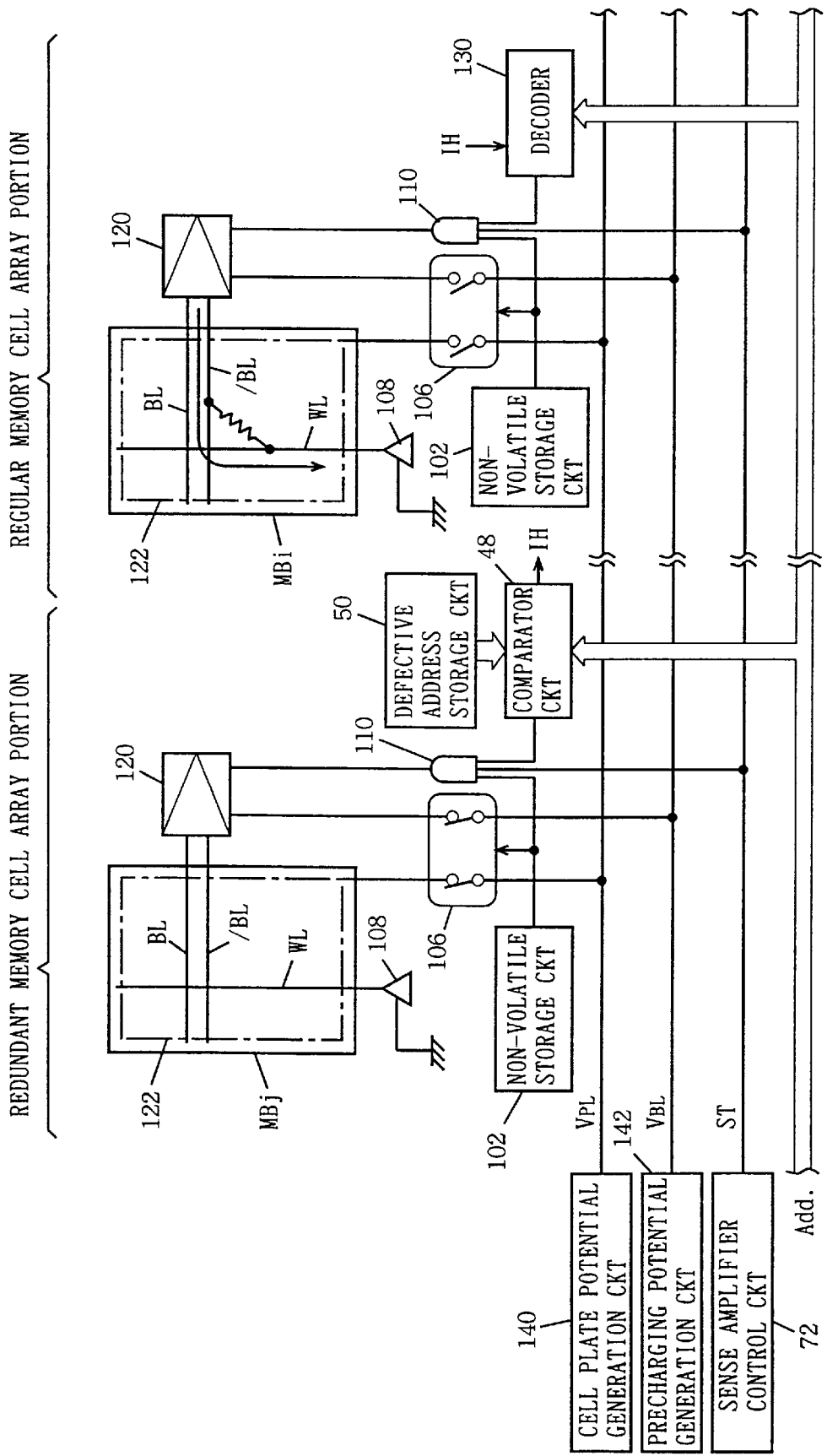
FIG. 7 is a schematic block diagram showing a configuration of a subblock of memory cells in a redundant memory cell array portion and a subblock of memory cells in a regular memory cell array portion of semiconductor memory device 1000.

FIG. 7 is a schematic block diagram showing a configuration of a data read circuit system in a regular memory cell array portion and a redundant memory cell array portion.

It is assumed that in the configuration shown in FIG. 7, there is a leakage caused between a word line WL and a bit line /BL in a subblock MBi of memory cells of the regular memory cell array portion. In this case, there is a current leakage path from a sense amplifier 120 via bit line /BL and word line WL to a word driver 108.

In the regular memory cell array portion, subblock MBi of memory cells has a cell plate electrode 122 of a memory cell included therein.

Sense amplifier 120 is provided for a pair of bit lines BL and /BL included in subblock MBi of memory cells. Word driver 108 is provided for word line WL.

A bit line precharging potential $V_{BL}$ from a precharging potential generation circuit 142 is supplied to sense amplifier 120 via a switch circuit 106. A cell plate potential $V_{PL}$ from a cell plate potential generation circuit 140 is supplied to cell plate 122 via switch circuit 106. A non-volatile storage circuit 102, which employs e.g. a fuse element to store whether a defective bit is present in the corresponding subblock MBi of memory cells, controls switch circuit 106 so that it attains a conductive or non-conductive state. Since there is a defective bit in subblock MBi of memory cells in the example shown in FIG. 7, switch circuit 106 is disconnected to prevent potentials $V_{BL}$ and $V_{PL}$ from being supplied to sense amplifier 120 and cell plate 122.

A timing at which sense amplifier 120 operates is controlled by an output from an AND circuit 110 which receives a timing signal ST output from a sense amplifier control circuit 72, an output signal from non-volatile storage circuit 102, and an output from a decoder circuit 130 which receives and decodes address signal Add.

More specifically, when any defective bit is present in the corresponding subblock MBi of memory cells, the signal output from non-volatile storage circuit 102 to AND circuit 110 attains an inactive low level and thus sense amplifier 120 does not receive timing signal ST.

When any defective bit is not present in subblock MBi of memory cells, the output signal from non-volatile storage circuit 102 attains an active high level. Thus, timing signal ST is transmitted to sense amplifier 120 while the signal output from decoder circuit 130 is held at an active high level in response to address signal Add.

Subblock MBj of memory cells included in the redundant memory cell array portion is similar in configuration to subblock MBi of memory cells in the regular memory cell array portion. Thus the identical portions thereof are denoted by identical reference characters and a description thereof is not repeated.

In the example shown in FIG. 7, subblock MBi of memory cells has a defective bit and is thus replaced with subblock MBj of memory cells of the redundant memory cell array portion.

Accordingly, non-volatile storage circuit 102 of the redundant memory cell array portion outputs a signal of high level. Responsively, switch circuit 106 conducts to supply potentials $V_{PL}$ and $V_{BL}$ to the cell plate 122 and sense amplifier 120 for subblock MBj of memory cells.

Comparator circuit 48 compares an applied address signal Add with the defective addresses held in defective address storage circuit 50. When the both addresses match, it applies a signal of active high level to AND circuit 108. Simultaneously, comparator circuit 48 outputs an access prohibiting signal IH to decoder 130 of the regular memory cell array portion. In response to signal IH, decoder 130 stops an access operation.

While AND circuit 110 of the redundant memory cell array portion receives an active signal from each of non-volatile storage circuit 102 and comparator circuit 48, timing signal ST is transmitted to sense amplifier 120, which amplifies the data read from the memory cell located at the connection point of a selected word line and selected bit lines BL and /BL.

The configuration as described above prevents subblock MBi in the regular memory cell array that includes any defective bit from receiving cell plate potential $V_{PL}$ and bit line precharging potential $V_{BL}$. Thus, any leakage current is restricted that flows from a bit line via a word line in subblock MBi of memory cells.

This allows reduction of the operating current in the standby state and hence reduction in power consumption during the standby period.

As has been described above, if subblock MBi of memory cells in the regular memory cell array portion has any defective bit, it is replaced with the corresponding subblock MBj of memory cells in the redundant memory cell array 30.

Such a configuration eliminates the necessity of arranging redundant memory cells in regular memory cell arrays. Thus, the area of the arrays can be reduced, and also the operation of replacing defective memory cells can be controlled only at the center of the chip and thus the defective address storage circuit, the comparator circuit and the like can be concentratedly arranged so that the number of e.g. fuse elements employed for programming can be reduced.

The configuration for replacement by means of a redundant circuit is, however, not limited to the configuration described above.

For example, a redundant circuit can be arranged only at the central array to provide block-for-block replacement as well as line-for-line (e.g. word line-for-line or bit line-for-bit line) replacement.

The configuration described above allows frequent occurrence of defects of lines to be accordingly replaced by means of the redundant circuit to provide relief with higher degree of freedom.

Furthermore, each of the nine memory cell arrays in three rows and three columns can be equivalently provided with a redundant memory cell, rather than dedicating the memory cell array located at the intersection of the second row and the second column to a redundant memory cell array, as shown in FIG. 1.

For example, a redundant memory cell can be provided for each main block 66 or 68 of memory cells having a capacity of 16M bits and shown in FIG. 2.

Figure 8:
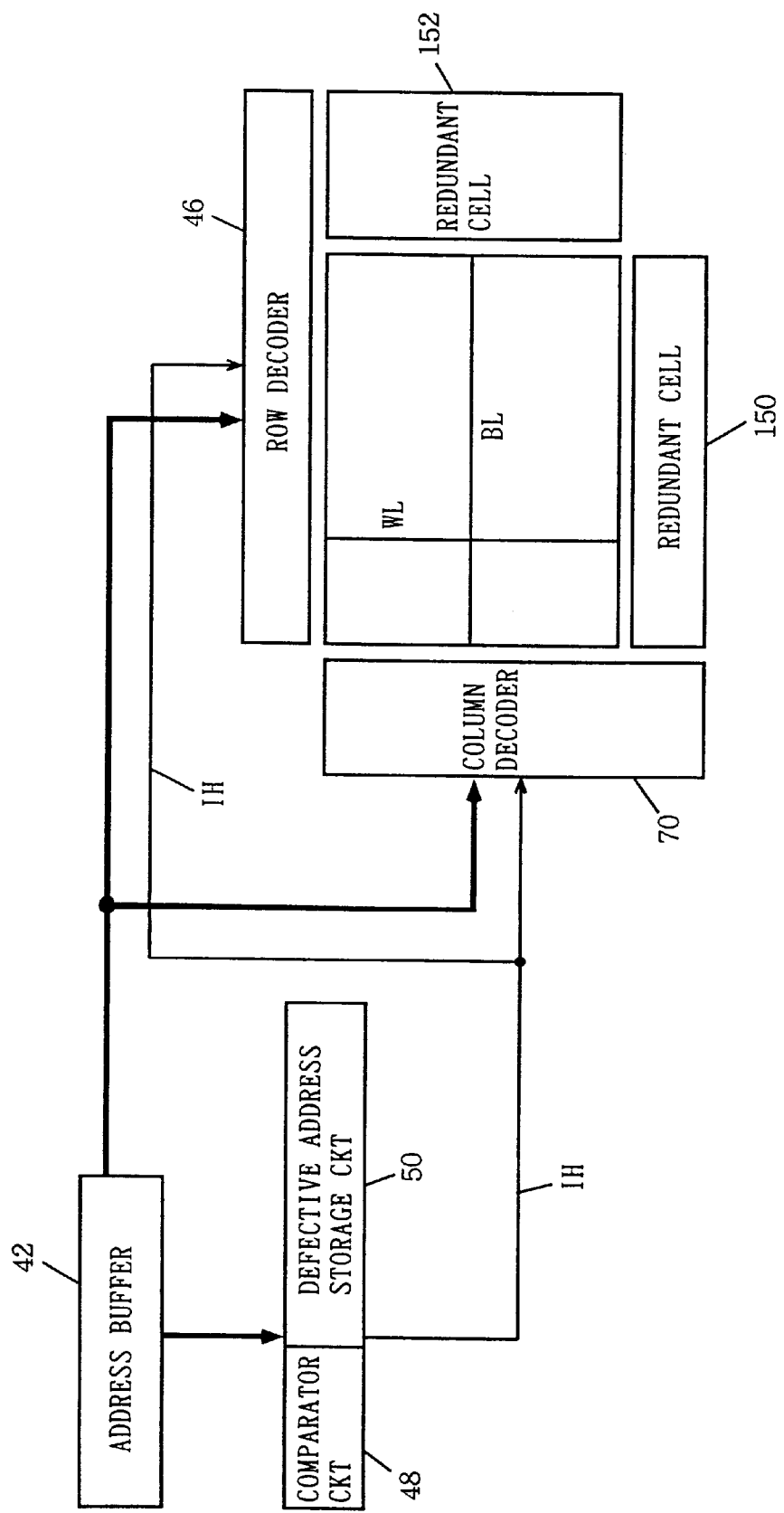
FIG. 8 is a conceptual view showing a variation of semiconductor memory device 1000 according to the first embodiment.

FIG. 8 is a schematic block diagram showing a configuration in such an example as described above.

Redundant cells 150 and 152 are provided such that they respectively correspond to the row and column directions of a main block of memory cells having 16M bits.

In contrast with the example shown in FIG. 4, a redundant memory cell array is not differentiated from a regular memory cell array. Accordingly, signal IH output from comparator circuit 48 to prohibit selection of regular memory cells is adapted to be applied to the column and row decoders provided for each main block of memory cells.

That is, each main block of memory cells is provided with comparator circuit 48, defective address storage circuit 50 and the like.

The rest of the configuration is similar to that shown in FIG. 4 and thus the identical portions are denoted by identical reference characters and a description thereof will not be repeated.

With such a configuration as described above, any defects frequently caused for each memory cell row or column can be effectively replaced by means of a redundant circuit.

Furthermore, with each of the nine memory cell arrays in three rows and three columns provided with redundant cells 150 and 152, as described above, the mode in which the memory cell array located at the intersection of the second row and column is operated as a redundant memory cell array for the other regular memory cell arrays can be switched to and from the mode in which the memory cell array arranged at the intersection of the second row and column is not differentiated from the other memory cell arrays and is thus operated as a memory cell array equivalent to the other memory cell arrays.

The configuration as described above provides the following advantage.

Typically, high defect rate and hence poor yield are often expected in the initial stage at which the manufacturing of memory devices developed employing the state-of-the-art process technology is started. In this stage, the centered memory cell array is used only as a redundant memory cell array. As the manufacturing technology is gradually completed, yield is improved and it is thus not necessary to dedicate the memory cell array located at the intersection of the second row and column to a redundant circuit. Accordingly, the mode of operation can be switched to operate the nine memory cell array as equivalent memory cells, which will be referred to as "x9 configuration" hereinafter.

These changes do not require changing circuits and can be switched by e.g. a fuse element.

Second Embodiment

Figure 9:
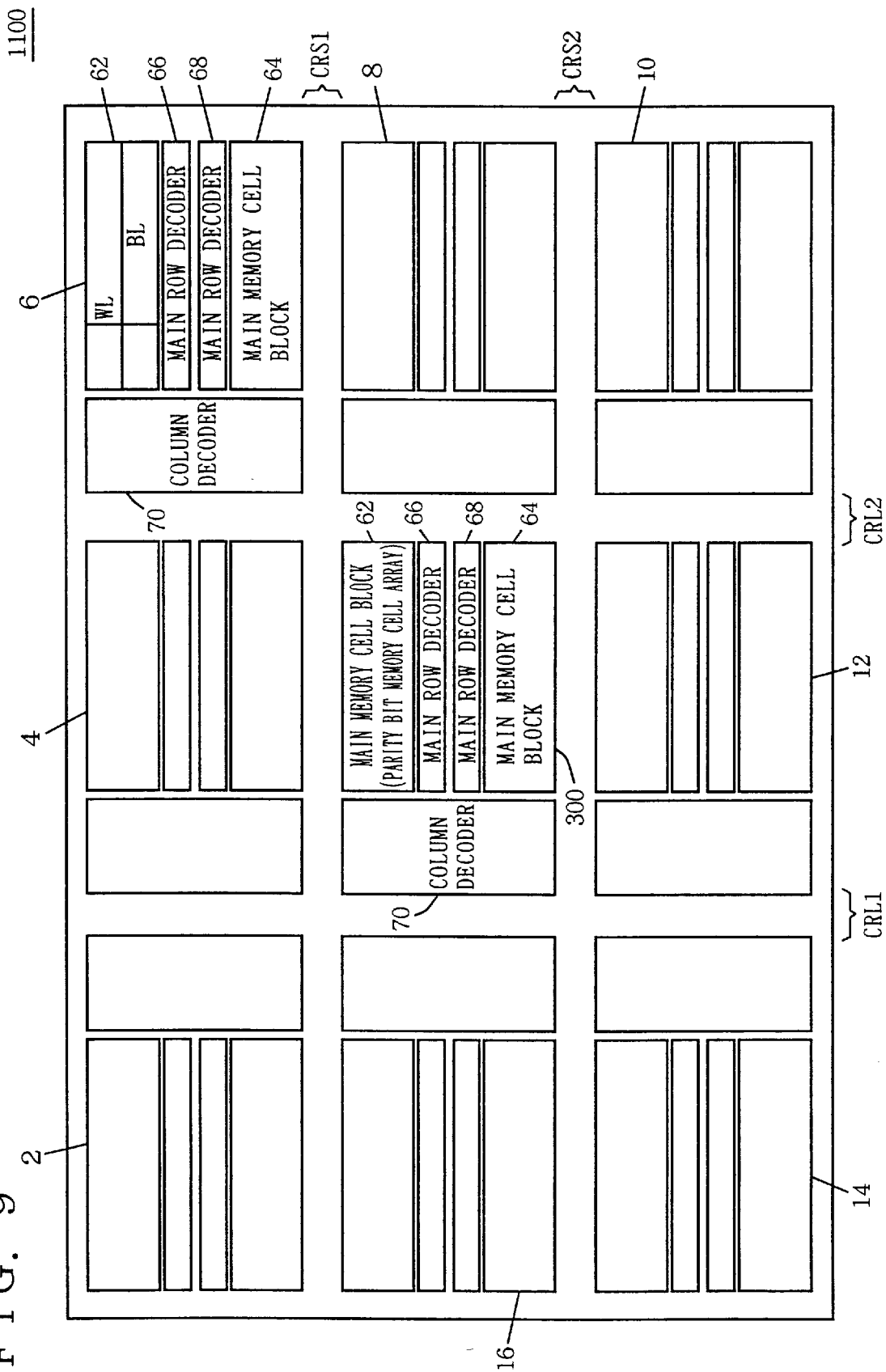
FIG. 9 is a plan view showing a configuration of a semiconductor memory device 1100 according to a second embodiment of the present invention.

FIG. 9 is a plan view showing a configuration of a semiconductor memory device 1100 according to a second embodiment of the present invention.

It is different in configuration from semiconductor memory device 1000 according to the first embodiment shown in FIG. 1 only in the configuration of a memory cell array 300 arranged at the intersection of the second row and the second column and the configuration of the peripheral circuitry provided therefor. The identical portions are denoted by identical reference characters and a description thereof will not be repeated.

Figure 10:
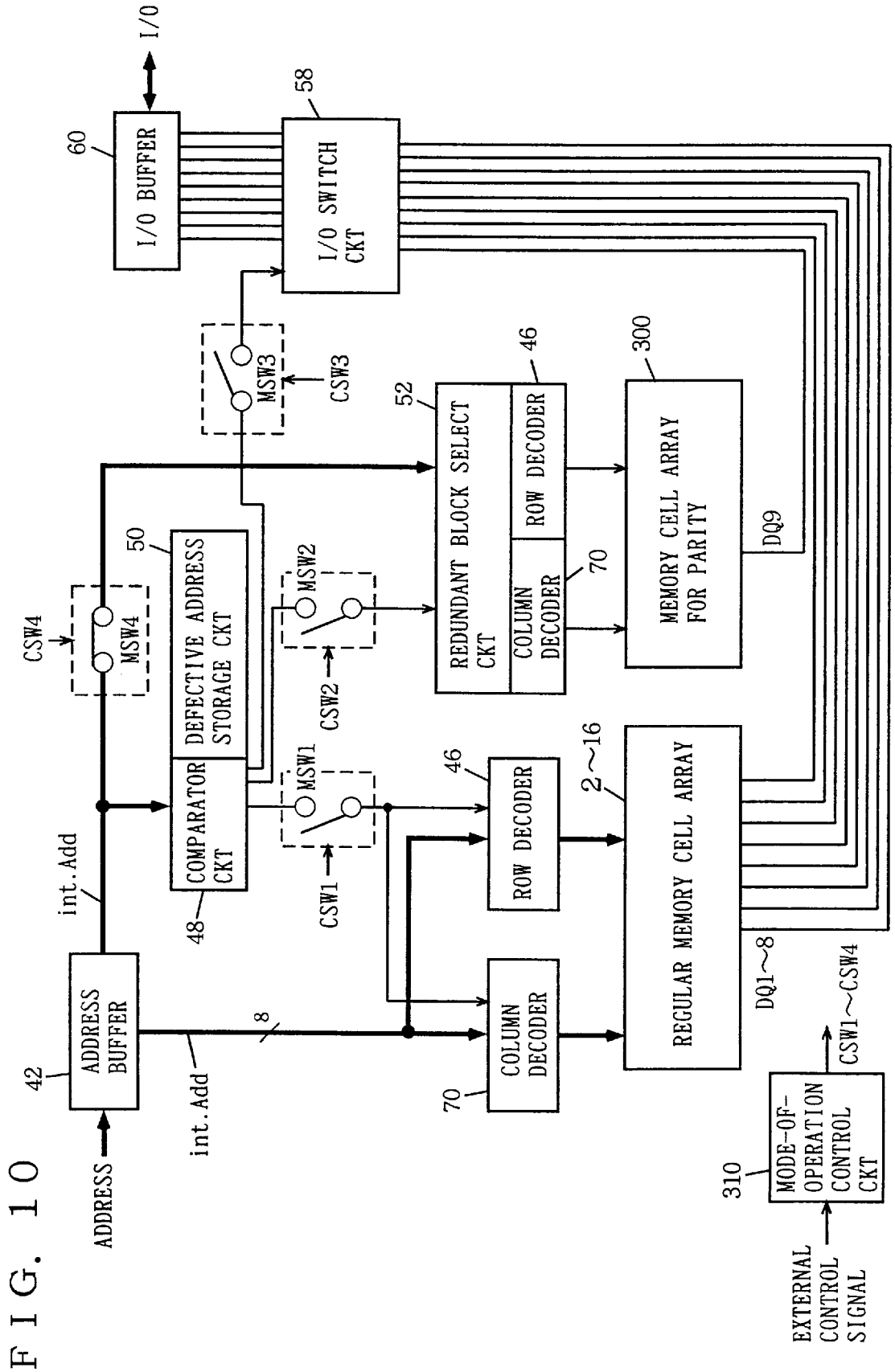
FIG. 10 is a schematic block diagram for describing an access operation of semiconductor memory device 1100.

FIG. 10 is a schematic block diagram showing a configuration of a circuit system which controls an operation of accessing memory cells of semiconductor memory device 1100 shown in FIG. 9.

It differs in configuration from the circuit controlling the access operation according to the first embodiment shown in FIG. 4 as follows.

According to the second embodiment, a mode-of-operation control circuit 310 responds to an external control signal to output signals CSW1–CSW4 for controlling the modes of operation of a circuit which controls the access operation.

Also in the circuit shown in FIG. 10, a switch circuit MSW1 switches the transmission of an access prohibiting signal from comparator circuit 48 to row decoder 46 for the regular memory cell arrays. A switch circuit MSW2 renders conductive or non-conductive the transmission path of a signal from comparator circuit 48 that activates an operation of a redundant block select circuit 52.

A switch circuit MSW3 renders conductive or non-conductive the path for transmitting a control signal from comparator circuit 48 to I/O switch circuit 58.

An internal address signal int.Add is transmitted from address buffer 42 to redundant block select circuit 52 via a path which is rendered conductive or non-conductive by a switch circuit MSW4. When switch circuit MSW4 is conductive, redundant block select circuit 52 responds to the internal address signal int.Add to provide an operation of selecting a corresponding memory cell in memory cell array 300.

Switch circuits MSW1–MSW4 are respectively controlled by signals CSW1–CSW4 output from mode-of-operation control circuit 310.

With such a configuration as described above, an operation similar to that of semiconductor memory device 1000 according to the first embodiment can be achieved in a first mode of operation designated in response to an externally applied control signal. Memory cell array 300 located at the intersection of the second row and column operates as a redundant memory cell array in the first mode of operation.

By contrast, while a second mode of operation is designated in response to an externally applied control signal, memory cell array 300 operates as a memory cell array which holds the parity data for the data read from the other memory cell arrays rather than a redundant memory cell array for the other memory cell arrays.

That is, the memory cell array located at the intersection of the second row and column of the memory cell arrays arranged in three rows and three columns can be used as a memory cell array dedicated to storing a parity bit so that the other memory cell arrays dispense with a memory cell for storing the parity bit.

Generally, when a memory cell which stores parity bit is arranged in a memory cell array, the area of the memory cell array will be increased by the memory cell for parity bit.

With the configuration shown in FIG. 9, however, a memory cell which holds parity bit can be mounted without any change in the regular memory cell arrays.

Furthermore, a memory cell array which holds parity bit can be arranged at an equal distance from all of the regular memory cell array blocks. Thus, the delay times of data, signals and the like can be minimized to provide efficient parity check.

FIG. 11 is a table of the states of switch circuits MSW1–MSW4 shown in FIG. 10 in the first and second modes of operation.

When memory cell array 300 located at the intersection of the second row and column is used as a redundant memory cell array in the first mode of operation, switch circuits MSW1–MSW3 are all rendered conductive and switch circuit MSW4 is rendered non-conductive.

Thus, an operation is provided which is basically similar to that according to the first embodiment shown in FIG. 4.

When the memory cell array located at the intersection of the second row and column is used as a memory cell array for parity bit in the second mode of operation, switch circuits MSW1–MSW3 are all disconnected and only switch circuit MSW4 is rendered conductive.

Accordingly, in response to an address signal applied to address buffer 42, redundant block select circuit 52 selects a corresponding memory cell in memory cell array 300 and parity data DQ9 is thus read and output from memory cell array 300 for parity.

Since switch MSW3 is in a non-conductive state, I/O switch circuit 58 does not provide the select operation and the data read from a regular memory cell array and data DQ9 read from memory cell array 300 for parity are externally output via I/O buffer 60.

Third Embodiment

Figure 12:
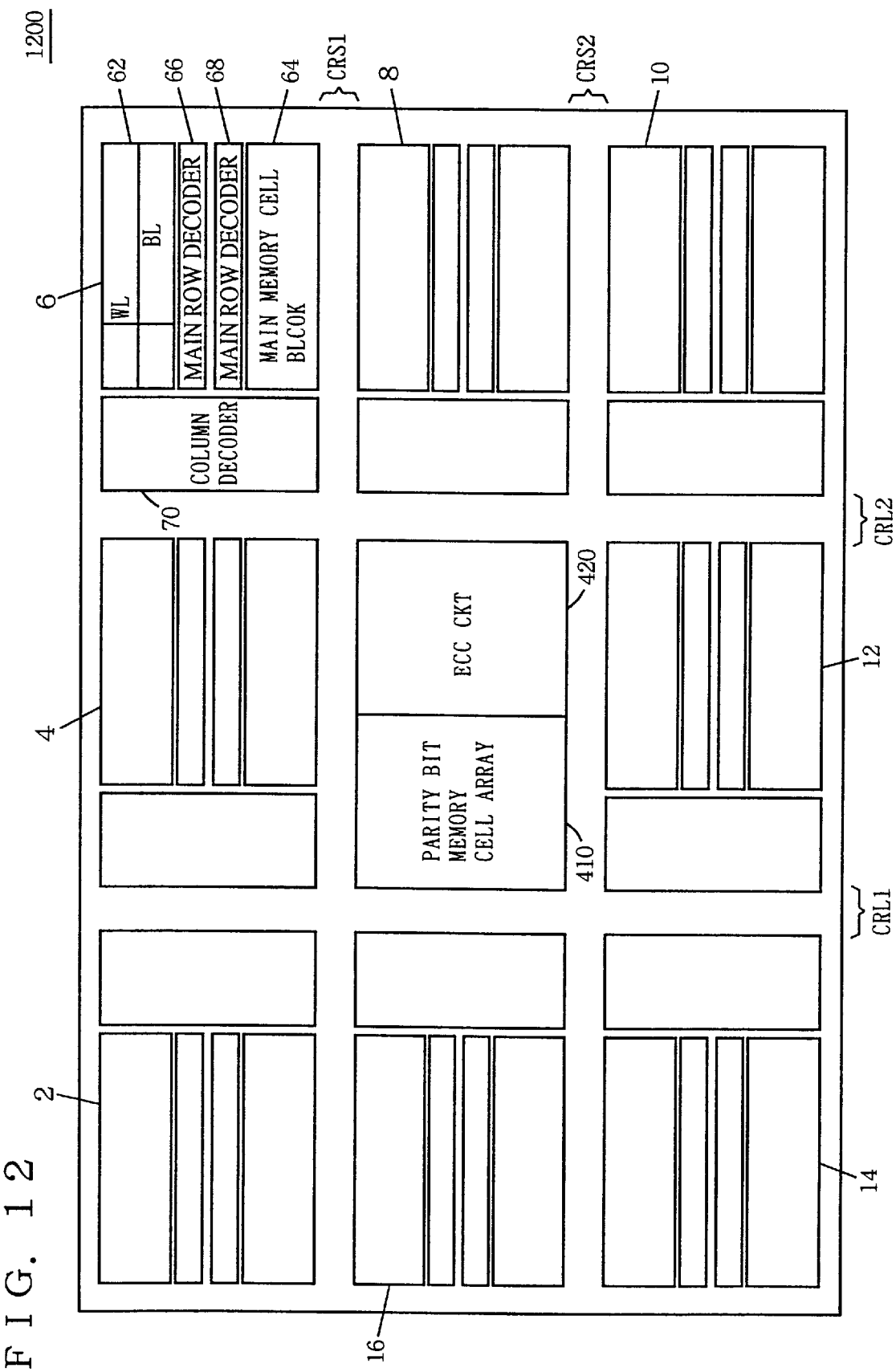
FIG. 12 is a plan view showing a configuration of a semiconductor memory device 1200 according to a third embodiment of the present invention.

FIG. 12 is a schematic block diagram showing a configuration of a semiconductor memory device 1200 according to a third embodiment.

Semiconductor memory device 1200 differs in configuration from semiconductor memory device 1100 shown in FIG. 1 in that a memory cell array 410 for holding parity bit, and an ECC circuit 420 are arranged in the region located at the intersection of the second row and column.

The other identical portions are denoted by identical reference characters and a description thereof will not be repeated.

Figure 13:
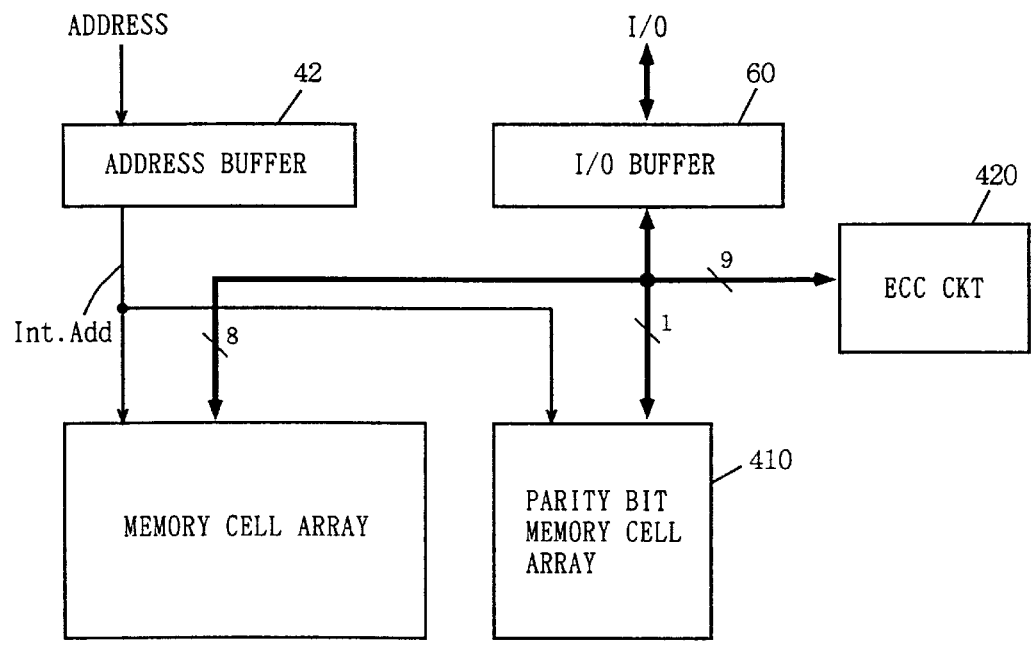
FIG. 13 is a schematic block diagram for describing an operation of semiconductor memory device 1200.

FIG. 13 is a schematic block diagram for illustrating an operation of semiconductor memory device 1200 shown in FIG. 12.

In the ECC operation cycle, address buffer 42 responds to an applied address signal to apply an internal address signal int.Add to memory cell arrays 2–16 and the parity bit memory cell array 410.

From a memory cell array, a plurality of data of a plurality of memory cells (e.g. a plurality of memory cells which belong to a same row and have their data simultaneously read when the corresponding word line is activated) including a selected memory cell are applied to ECC circuit 420. Depending on the selected memory cell, parity data is applied from parity memory cell array 410 to ECC circuit 420.

In response to the data from parity memory cell array 410 and the plurality of data from the memory cell array, ECC circuit 420 provides error correction and rewrites the data in a corresponding memory cell.

Thus, in the read operation, the data corrected according to parity bit data is output to the external.

Figure 14:
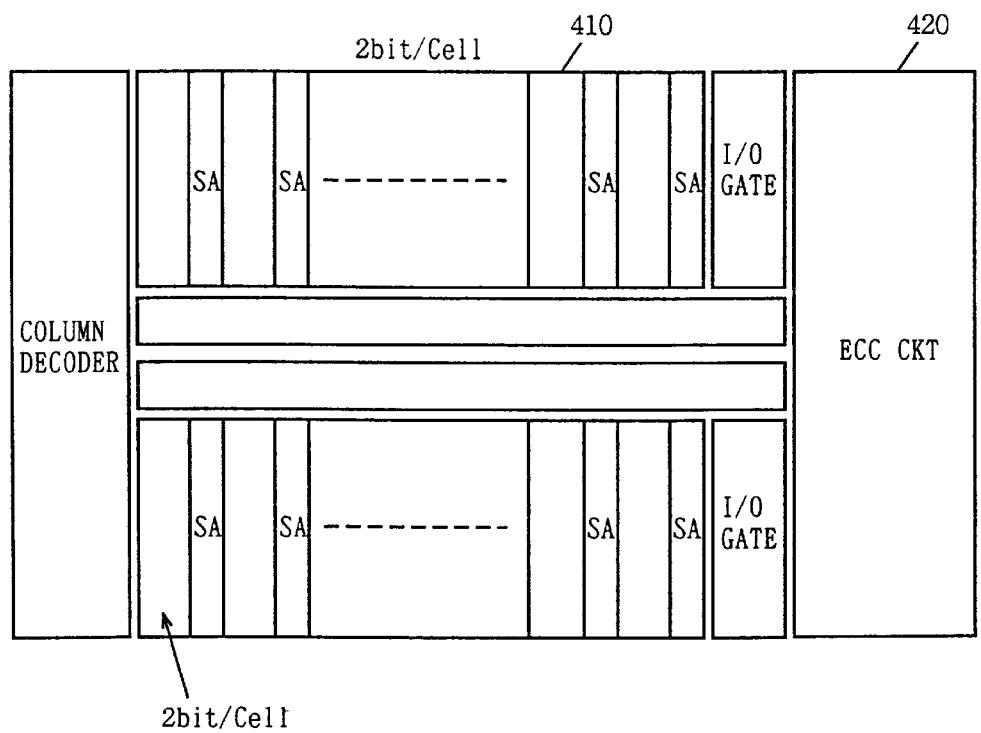
FIG. 14 is a conceptual view showing a configuration of a parity memory cell array 410.

FIG. 14 is a plan view for more specifically illustrating the configuration of parity memory cell array 410 shown in FIG. 13.

Parity memory cell array 410 can be configured, for example, such that quadruple-level data is written in a single memory cell to hold the parity data for the corresponding eight memory cell arrays.

For example, memory cells as many as 8M 1-bit memory cells for storing binary data can store data of 16M bits.

Accordingly, sense amplifier SA is adapted to be capable of quadruple-level detection.

With such a configuration as described above, the parity bit data for each memory cell of the surrounding eight memory cell arrays can be held merely by the parity memory cell array located at the center, i.e. the intersection of the second row and column.

Correcting read data automatically in a chip and externally outputting the corrected data, as described above, results in a more reliable semiconductor memory device. Generally, semiconductor memory devices with an ECC circuit and the like require larger chip area in order to mount the ECC circuit and the like thereon.

For the arrangement of a memory cell array in which memory cell array mats are arranged in three rows and three columns, however, ECC circuit 420, parity bit memory cell array 410 and the like can be sufficiently mounted at the center portion.

Since parity memory cell array 410 and ECC circuit 420 are arranged at the center portion surrounded by memory cell arrays, the delay in data access time can be minimized. This results in efficient error detection and correction and hence a highly reliable memory.

Fourth Embodiment

Figure 15:
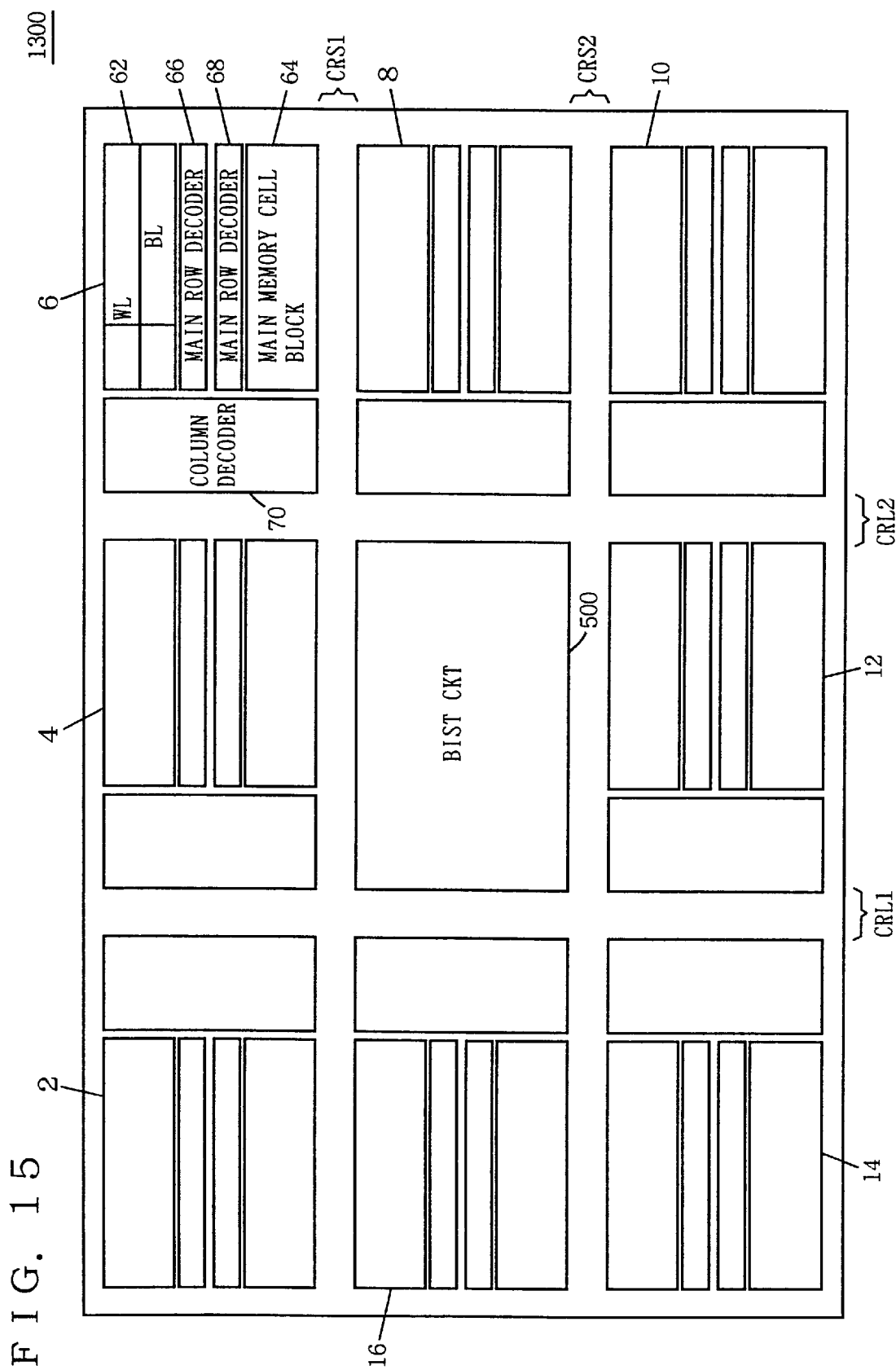
FIG. 15 is a plan view showing a configuration of a semiconductor memory device 1300 according to a fourth embodiment of the present invention.

FIG. 15 is a plan view showing configuration of a semiconductor memory device 1300 according to a fourth embodiment of the present invention.

It differs in configuration from semiconductor memory device 1000 according to the first embodiment shown in FIG. 1 in that a built-in self test (BIST) circuit 500 for providing a built-in self test is mounted in the region located at the intersection of the second row and the second column.

The rest of the configuration is similar to the configuration of semiconductor memory device 1000 according to the first embodiment, and thus the identical portions are denoted by identical reference characters and a description thereof will not be repeated.

Figure 16:
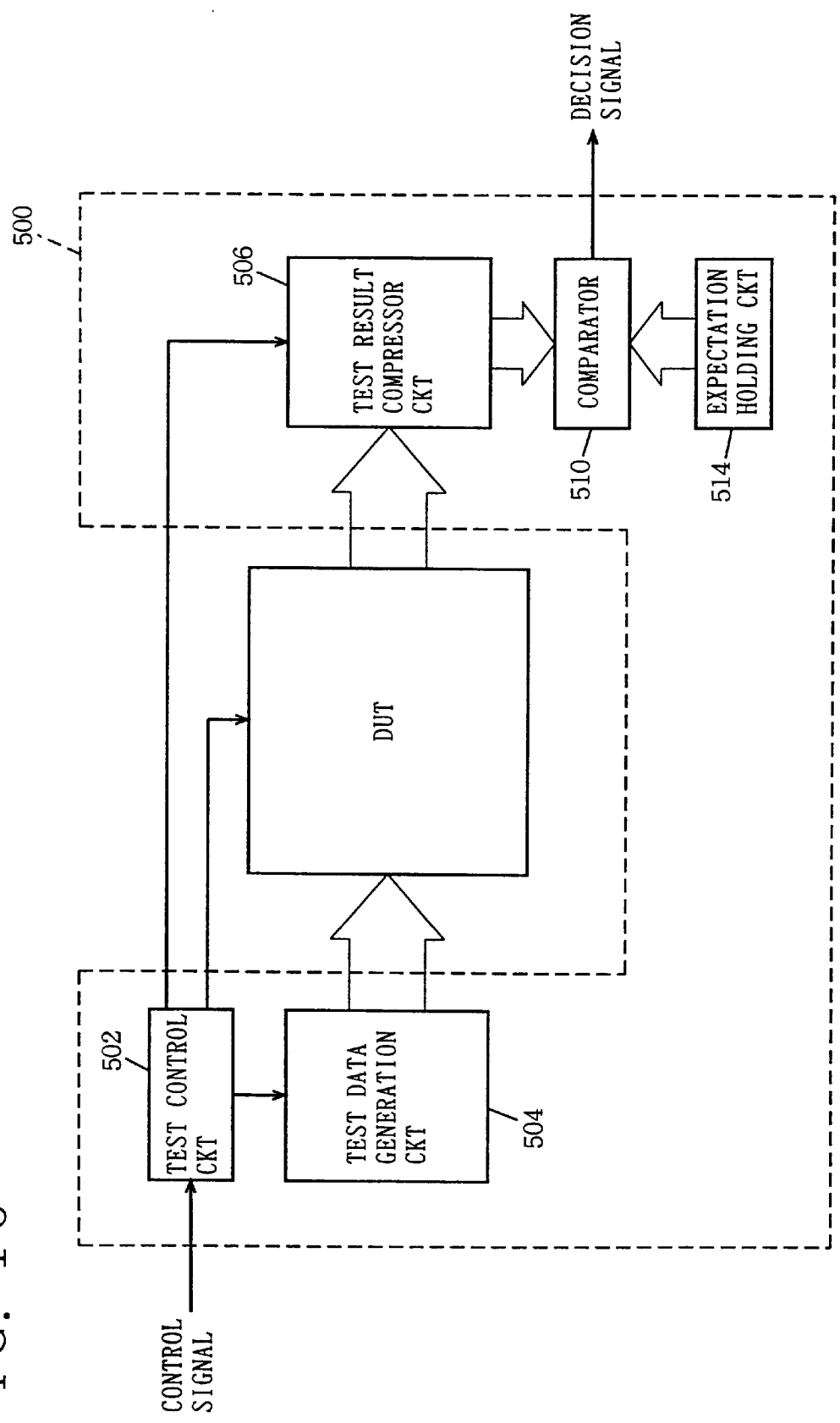
FIG. 16 is a schematic block diagram showing a configuration of a BIST circuit 500.
Figure 17:
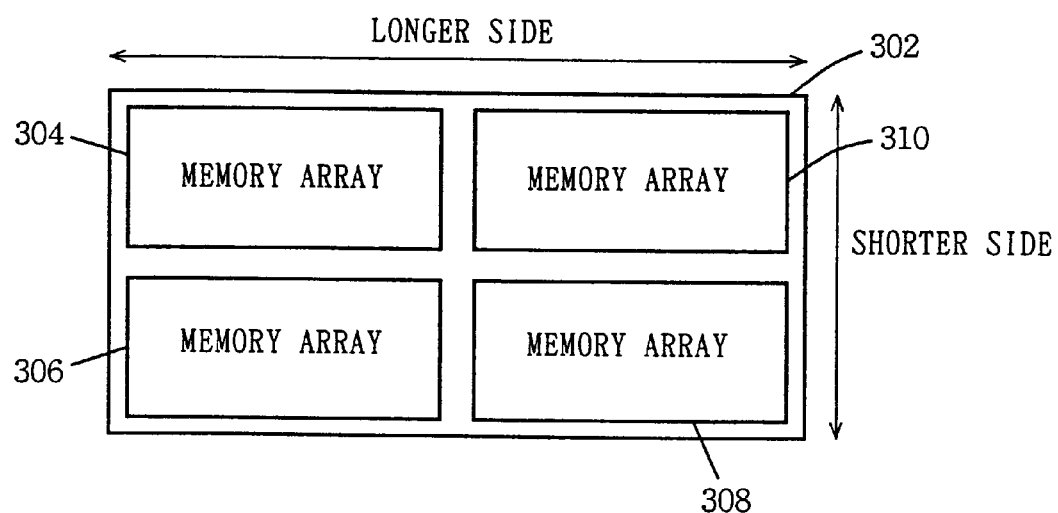
FIG. 17 is a schematic block diagram showing a configuration of a conventional DRAM 302.

FIG. 16 is a schematic block diagram showing a configuration of BIST circuit 500.

The reference character DUT indicated in the figure denotes the circuit inspected by the BIST circuit, i.e. regular memory cell arrays 2–16 in the present embodiment.

BIST circuit 500 includes: a test control circuit 502 responsive to an external control signal for controlling a test operation; a test data generation circuit 504 controlled by test control circuit 502 to apply test data to the DUT; a test result compressor circuit 506 controlled by test control circuit 502 to compress and output the data output from the DUT; an expectation holding circuit 508 for holding an expected value for a test result; and a comparator 510 which compares the data from test result compressor circuit 506 with the data from expectation holding circuit 508 and outputs a signal indicating a decision result of pass/failure.

With such a configuration as described above, the external LSI tester which tests semiconductor memory device 130 need only generate a start signal and a clock signal applied to test control circuit 502, and determines finally whether the chip tested passes or fails to pass the test according to a result decision signal output from the chip after a predetermined period of time.

In other words, the load on the external LSI tester is significantly alleviated.

Furthermore, the arrangement of BIST circuit 500 at the intersection of the second row and column, i.e. the center of a chip, can minimize the length of the interconnections to BIST circuit 500, and hence minimize the delay times of data, signal and the like and thus conduct an efficient test.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed at a main surface of one of chips that a semiconductor substrate is divided into, comprising:

eight memory cell arrays respectively arranged at regions obtained by dividing said main surface into three rows and three columns except for a region located at an intersection of a second row and a second column, each said memory cell array including a plurality of word lines, a plurality of pairs of bit lines intersecting with said plurality of word lines, and a plurality of memory cells provided respectively corresponding to intersections of said plurality of word lines and said plurality of pairs of bit lines, each said memory cell array being divided into a plurality of first subblocks each having a first predetermined number of memory cell columns and a second predetermined number of memory cell rows;

a redundant memory cell array arranged at said region located at the intersection of said second row and said second column, said redundant memory cell array being divided into a plurality of second subblocks each having said first predetermined number of memory cell columns and said second predetermined number of memory cell rows; and replacement means for replacing a defective said first subblock of said memory cell array with a corresponding said second subblock of said redundant memory cell array according to an external setting.

2. The semiconductor memory device according to claim 1, further comprising:

cell plate potential generation means for generating a cell plate potential supplied to a cell plate of said memory cell;

precharging potential generation means for generating a precharging potential for said pair of bit lines;

first setting means provided for each said first subblock for selectively setting supply of said cell plate potential and said precharging potential to a corresponding said first subblock according to an external setting; and second setting means provided for each said second subblock for selectively setting supply of said cell plate potential and said precharging potential to a corresponding said second subblock according to an external setting.

3. The semiconductor memory device according to claim 1, wherein:

each of said eight memory cell arrays further includes a redundant memory cell replacing any defective memory cell; and said redundant memory cell array further includes a redundant memory cell replacing any defective memory cell present in said redundant memory cell array.

4. A semiconductor memory device formed at a main surface of one of chips that a semiconductor substrate is divided into, comprising:

eight memory cell arrays respectively arranged at regions obtained by dividing said main surface into three rows and three columns except for a region located at an intersection of a second row and a second column, each said memory cell array including a plurality of word lines, a plurality of pairs of bit lines intersecting with said plurality of word lines, and a plurality of memory cells provided respectively corresponding to intersections of said plurality of word lines and said plurality of pairs of bit lines;

an auxiliary memory cell array arranged in said region located at the intersection of said second row and said second column; and operation switching means for replacing any defective memory cell included in said memory cell array with a corresponding memory cell of said auxiliary memory cell array in a first mode of operation according to an external setting, and for outputting data from a memory cell in said memory cell array and data from a memory cell in said auxiliary memory cell array both selected according to an externally applied address in a second mode of operation according to an external setting.

5. The semiconductor memory device according to claim 4, each said memory cell array being divided into a plurality of first subblocks each having a first predetermined number of memory cell columns and a second predetermined number of memory cell rows, said auxiliary memory cell array being divided into a plurality of second subblocks each having said first predetermined number of memory cell columns and said second predetermined number of memory cell rows, said operation switching means in said first mode of operation replacing any defective said first subblock included in said memory cell array with a corresponding said second subblock of said redundant memory cell array according to an external setting and thus operating the corresponding said second subblock of said redundant memory cell array, said semiconductor memory device further comprising:

a cell plate potential generation means for generating a cell plate potential supplied to a cell plate of said memory cell;

precharging potential generation means for generating a precharging potential for said pair of bit lines;

first setting means provided for each said first subblock for selectively setting supply of said cell plate potential and said precharging potential to a corresponding said first subblock according to an external setting; and second setting means provided for each said second subblock for selectively setting supply of said cell plate potential and said precharging potential to a corresponding said second subblock according to an external setting.

6. A semiconductor memory device formed at a main surface of one of chips that a semiconductor substrate is divided into, comprising:

eight memory cell arrays respectively arranged in regions obtained by dividing said main surface into three rows and three columns except for a region located at an intersection of a second row and a second column, each said memory cell array including a plurality of word lines, a plurality of pairs of bit lines intersecting with said plurality of word lines, and a plurality of memory cells provided respectively corresponding to intersections of said plurality of word lines and said plurality of pairs of bit lines; and operation means arranged in said region located at the intersection of the second row and the second column, for detecting an error in data held in a memory cell selected from said memory cell array, based on data read from said memory cell from selected from said memory cell array.

7. The semiconductor memory device according to claim 6, wherein:

said operation means includes error correction means for correcting the error in the data read from the memory cell selected in said memory cell array; and said error correction means includes parity bits storage means for holding a parity bit for providing error correction with respect to a corresponding memory cell, and correction operation means for correcting the error in the data from said selected memory cell, based on a plurality of data read from said memory cell array including the data read from said selected memory cell and on a corresponding said parity bit data.

8. The semiconductor memory device according to claim 6, wherein said operation means includes test means for self-testing operations of writing into and reading from memory cells of said memory cell array.

* * * * *